US008884159B2

(12) United States Patent
Huang (10) Patent No.: US 8,884,159 B2
(45) Date of Patent: Nov. 11, 2014

(54) PHOTOVOLTAIC DEVICES WITH METAL SEMICONDUCTOR ALLOY METALLIZATION (75) Inventor: Qiang Huang, Croton on Hudson, NY (US)

(73) Assignee: International Business Machines Corporation, Armonk, NY (US)

(*) Notice: Subject to any disclaimer, the term of this patent is extended or adjusted under 35 U.S.C. 154(b) by 50 days.

(21) Appl. No.: 13/232,657

(22) Filed: Sep. 14, 2011

(65) Prior Publication Data
US 2013/0061917 A1    Mar. 14, 2013

(51) Int. Cl.
| H01L 31/00 | (2006.01) |
| C25D 7/12 | (2006.01) |
| C25D 5/12 | (2006.01) |
| H01L 31/0224 | (2006.01) |
| C25D 5/50 | (2006.01) |
| C25D 3/38 | (2006.01) |

(52) U.S. Cl.
CPC .......... *H01L 31/022425* (2013.01); *C25D 7/12* (2013.01); *C25D 5/12* (2013.01); *C25D 3/38* (2013.01); *C25D 5/50* (2013.01); *Y02E 10/50* (2013.01)
USPC ..................................... 136/265

(58) Field of Classification Search
CPC .. H01L 31/022425; Y02E 10/50; C25D 5/12; C25D 5/50; C25D 7/12; C25D 3/38
USPC .................................. 136/252, 265
See application file for complete search history.

(56) References Cited

U.S. PATENT DOCUMENTS

| 5,011,565 A | * | 4/1991 | Dube et al. ................. 438/98 |
| 5,395,795 A | | 3/1995 | Hong et al. |
| 8,257,998 B2 | * | 9/2012 | Sachs et al. ................. 438/71 |
| 2002/0115292 A1 | | 8/2002 | Andricacos et al. |

(Continued)

FOREIGN PATENT DOCUMENTS

| WO | WO2008100603 | 8/2008 |
| WO | WO2009114446 | 9/2009 |
| WO | WO2011054037 | 5/2011 |

OTHER PUBLICATIONS

Nguyen, A., et al., "Formation of a Low Ohmic Contact Nickel Silicide Layer on Textured Silicon Wafers Using Electroless Nickel Plating", 25th European Photovoltaic Solar Energy Conference and Exhibition / 5th World, Conference on Photovoltaic Energy Conversion, Sep. 6-10, 2010, Valencia, Spain, pp. 2672-2675.

(Continued)

*Primary Examiner* — Tamir Ayad
(74) *Attorney, Agent, or Firm* — Scully, Scott, Murphy & Presser, P.C.; Louis J. Percello, Esq.

(57) ABSTRACT

A photovoltaic device, such as a solar cell, having improved performance is provided. In one embodiment, the photovoltaic device includes a multimetal semiconductor alloy layer located on exposed portions of a front side surface of a semiconductor substrate. The multimetal semiconductor alloy layer includes at least a first elemental metal that forms an alloy with a semiconductor material, and a second elemental metal that differs from the first elemental metal and that does not form an alloy with a semiconductor material at the same temperature as the first elemental metal. The photovoltaic device further includes a copper-containing layer located atop the multimetal semiconductor alloy layer.

26 Claims, 3 Drawing Sheets

(56) References Cited

U.S. PATENT DOCUMENTS

| | | | |
|---|---|---|---|
| 2008/0128268 A1* | 6/2008 | Lopatin et al. | 204/192.1 |
| 2010/0003817 A1 | 1/2010 | Hamm et al. | |
| 2010/0037944 A1* | 2/2010 | Sater | 136/255 |
| 2011/0207320 A1* | 8/2011 | Sun et al. | 438/653 |
| 2011/0309508 A1 | 12/2011 | Cabral, Jr. et al. | |

OTHER PUBLICATIONS

Bartsch, J., et al., "Copper As Conducting Layer in Advanced Front Side Metallization Processes for Crystalline Silicon Solar Cells, Exceeding 20% on Printed Seed Layers", 35th PVSC, Jun. 20-25, 2010, Honolulu, Hawaii.

Bartsch, J. et al., "Quick Determination of Copper-Metallization Long-Term Impact on Silicon Solar Cells", J. Electrochem. Soc., Published Aug. 13, 2010, vol. 157, Issue 10, Semiconductor Devices, Materials, and Processing.

Hoerteis, M., et al., "Electrical properties of fine line printed and light-induced plated contacts on silicon solar cells", Progress in Photovoltaics: Research and Applications, Prog. Photovolt: Res. Appl., Published online Mar. 30, 2010 in Wiley InterScience, 18:240-248.

Chaudhari, V., et al., "A Novel Two Step Metallization of Ni/Cu for Low Concentrator c-Si Solar Cells", Solar Energy Materials & Solar Cells, Jul. 23, 2010, 94, pp. 2094-2101.

International Search Report and Written Opinion dated Dec. 4, 2012 received in a corresponding foreign application.

Office Action dated Jul. 17, 2013 received in a related U.S. Patent Application, namely U.S. Appl. No. 13/602,120.

\* cited by examiner

PHOTOVOLTAIC DEVICES WITH METAL SEMICONDUCTOR ALLOY METALLIZATION

BACKGROUND

The present disclosure relates to a photovoltaic device and a method of manufacturing the same. More particularly, the present disclosure relates to a photovoltaic device, such as a solar cell, including a multimetal semiconductor alloy layer. The present disclosure also provides a method for forming the same. The present disclosure also provides a method for forming a photovoltaic device containing a single metal semiconductor alloy layer that is formed from a multimetal layer.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped regions, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

The majority of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

For advanced and experimental high efficiency solar cells in laboratories, vacuum based metallization processes may be used with an inevitable higher cost and low throughput.

Very recently, metallization with a plated copper grid has been reported. However, the plated copper can easily diffuse into the silicon solar cells and damage the solar cells performance. To prevent this detrimental effect, diffusion barriers, such as nickel silicide and/or nickel, have been employed. Nickel silicide may provide good contact resistance with silicon and at the same time, to a certain degree, prevent copper diffusion. A nickel layer may be used to improve adhesion or diffusion properties. However, even with these diffusion barriers, the solar cell performance may still degrade at a certain elevated temperature or after a certain long time of operation.

In addition, copper metallization is typically achieved utilizing electroplating. The electroplated Ni layer has to be coalescent to form a continuous Ni silicide layer. Therefore, the Ni layer that is formed by electroplating is generally a thick layer. Furthermore, the plated Ni layer can have variations in its thickness. As such, when the plated Ni is fully converted into Ni silicide during the silicidation process, a comparatively thick Ni silicide or a Ni silicide layer with comparatively large thickness variations forms. When the plated Ni is only partially converted into Ni silicide by controlling the silicidation process, for example the temperature, the thickness of Ni silicide can have large variation when the solar cell substrate has variations in its properties, resulting in both no silicide and thick Ni silicide at certain different locations. This thick Ni silicide can be thicker than the p-n junction in the solar cell and, as a result, the formation of a thick Ni silicide may damage the cell.

Therefore, a copper metalized solar cell structure with good contact resistance between metal and semiconductor substrate and further improved solar cell lifetime is needed.

Moreover, a method of making a copper metalized solar cell with a uniform metal silicide layer is needed. Such a method is particularly needed for solar cells with a semiconductor substrate having large variations in its properties.

SUMMARY

A photovoltaic device, such as a solar cell, having improved performance and a method of forming the same are provided. In one embodiment of the disclosure, a multimetal semiconductor alloy layer is formed on exposed portions of a front side surface of a semiconductor substrate. The multimetal semiconductor alloy layer includes at least a first elemental metal that forms an alloy with a semiconductor material, and a second elemental metal that differs from the first elemental metal and that does not form an alloy with a semiconductor material at the same temperature as first elemental metal. An optional additional metal diffusion barrier layer can be formed on the multimetal semiconductor alloy layer, and a copper-containing layer can be formed atop either the multimetal semiconductor alloy layer, or the optional metal diffusion barrier layer.

The multimetal semiconductor alloy layer of this embodiment of the present disclosure results in a photovoltaic device having a better uniformity of metal semiconductor alloy thickness with easier control as compared to an equivalent device that does not include the multimetal semiconductor alloy layer. Moreover, the multimetal semiconductor alloy layer of this embodiment of the present disclosure results in a photovoltaic device having longer life time as compared to an equivalent device that does not include the multimetal semiconductor alloy layer.

In one embodiment of the present disclosure, a method of forming a photovoltaic device including a multimetal semiconductor alloy layer is provided. The method of this embodiment of the present disclosure includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate. Patterned antireflective coatings are formed on the front side surface of the semiconductor substrate to provide a grid pattern on the front side surface. The grid pattern includes exposed portions of the front side surface of the semiconductor substrate. A multimetal semiconductor alloy layer is then formed on the exposed portions of the front side surface of the semiconductor substrate. In accordance with the present disclosure, the multimetal semiconductor alloy layer includes at least a first elemental metal that forms a semiconductor alloy at a first anneal temperature, and at least a second elemental metal that is different from the first elemental metal and does not form a metal semiconductor alloy at the first anneal temperature. An optional metal diffusion barrier layer can then be electrodeposited on the metal semiconductor alloy layer, and thereafter a copper-containing layer is electrodeposited either atop the multimetal semiconductor alloy layer or the optional metal diffusion barrier layer.

In yet another embodiment of the present disclosure, a photovoltaic device including a single metal semiconductor alloy is provided from a multimetal layer. This embodiment of the present disclosure is similar to the one mentioned above except that the second elemental metal is not present in the semiconductor alloy. Instead, a single metal semiconductor alloy layer is formed that consists essentially of the first elemental metal and a semiconductor component. This embodiment of the present disclosure provides a photovoltaic device in which the uniformity of the metal semiconductor alloy is improved. This method of the present disclosure includes a step of forming a multimetal layer on exposed portions of a front side surface of a semiconductor substrate. The multimetal layer includes at least a first elemental metal that forms a semiconductor alloy at a first anneal temperature, and at least a second elemental metal that is different from the first elemental metal and does not form a metal semiconductor alloy at the first anneal temperature. This method further includes a step of converting the multimetal layer into a single metal semiconductor alloy layer that consists essentially of the first elemental metal and a semiconductor component. A copper-containing layer can then be electrodeposited atop the single metal semiconductor alloy layer.

In yet another embodiment of the present disclosure a photovoltaic device is provided. The photovoltaic device of the present disclosure includes a semiconductor substrate including a p-n junction with a p-type semiconductor portion and an n-type semiconductor portion one on top of the other, wherein an upper exposed surface of one of the semiconductor portions represents a front side surface of the semiconductor substrate. The disclosed device further includes patterned antireflective coatings on the front side surface of the semiconductor substrate, wherein the patterned antireflective coatings protect some portions of the front side surface of the semiconductor substrate, while leaving other portions of the front side surface of the semiconductor substrate exposed. The other portions of the front side surface of the semiconductor substrate that are exposed form a grid pattern on the front side surface. The disclosed device yet further includes a multimetal semiconductor alloy layer located on the other portions of the front side surface of the semiconductor substrate that are exposed. In accordance with the present disclosure, the multimetal semiconductor alloy layer includes at least a first elemental metal that forms an alloy with a semiconductor material, and at least a second elemental metal that differs from the first elemental metal and that does not form an alloy with the semiconductor material at the same temperature as the first elemental metal. The photovoltaic device can also include an optional metal diffusion barrier layer located on the metal semiconductor alloy layer, and a copper-containing layer located atop either the multimetal semiconductor alloy layer or the optional metal diffusion barrier layer.

DETAILED DESCRIPTION

The present disclosure, which provides photovoltaic devices, such as solar cells, having improved performance, especially lifetime, and a method of forming such devices will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
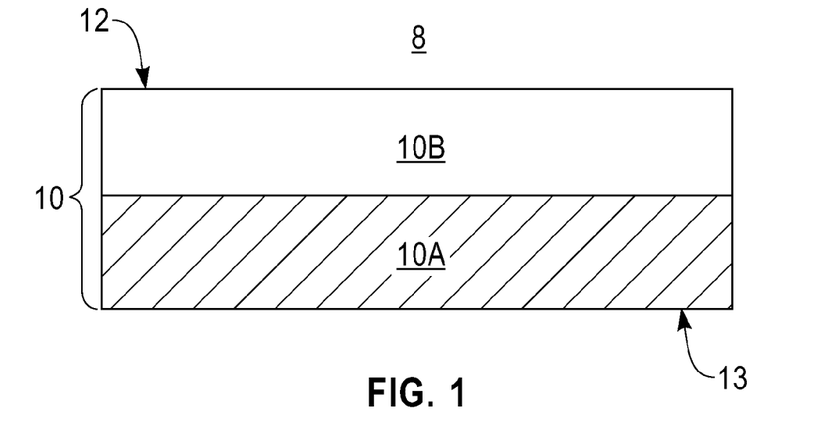
FIG. 1 is a pictorial representation (through a cross sectional view) illustrating an initial structure that can be employed in one embodiment of the present disclosure.

Referring now to FIG. 1, there is illustrated an initial structure 8 that can be employed in one embodiment of the present disclosure. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP, CdTe, CuInSe$_2$, Cu(InGa)Se$_2$, and all other III/V, II/VI, or I/III/VI compound semiconductors. In one embodiment of the present disclosure, the semiconductor substrate 10 is comprised of silicon. In another embodiment, the semiconductor substrate 10 is comprised of a single crystalline semiconductor material. In another embodiment, the semiconductor substrate 10 is comprised of a multicrystalline semiconductor material. In yet another embodiment, the semiconductor substrate 10 is comprised of multiple layers of different semiconductor materials, for example, with different energy band gaps.

The semiconductor substrate 10 illustrated in FIG. 1 includes a p-type semiconductor portion 10A that includes a p-type dopant, and an overlying n-type semiconductor portion 10B that includes an n-type dopant. In some embodiments (not shown), the p-type semiconductor portion of the substrate overlies the n-type semiconductor portion. In such an embodiment, the order of semiconductor portions 10A and 10B would be reversed from that shown, i.e., p-type semiconductor portion 10A would be located atop the n-type semiconductor portion 10B. Also, in such an embodiment, an exposed surface of p-type semiconductor portion 10A would be used as the front side surface of the semiconductor substrate 10. In one embodiment of the present invention, the semiconductor portions 10A and 10B have a uniform thickness. In another embodiment, the semiconductor portions 10A and 10B have various thicknesses at different locations.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor substrate and the type of dopant atom being employed. The p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, laser doping, liquid solution spray/mist doping, and/or out-diffusion of a dopant atom from an overlying sacrificial dopant material layer that can be formed on the substrate, and removed after the out-diffusion process. In some embodiments of the present disclosure, the dopant(s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of a single crystalline silicon semiconductor substrate. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

Although the following drawings and description illustrate processing the n-type semiconductor portion 10B of the semiconductor substrate 10, the following description can also be applied to processing the p-type semiconductor portion 10A of the semiconductor substrate 10 in embodiments in which the p-type semiconductor portion 10A is located atop the n-type semiconductor portion 10B.

Figure 2:
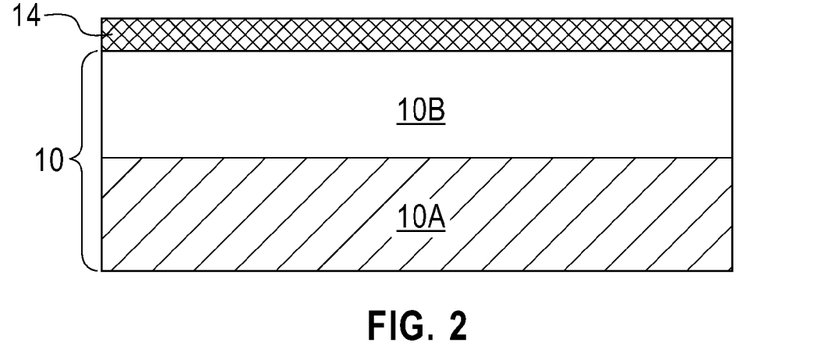
FIG. 2 is a pictorial representation (through a cross sectional view) illustrating the initial structure of FIG. 1 after forming a blanket layer of an antireflective coating on a front side surface of the initial structure.

Referring now to FIG. 2, there is illustrated the structure of FIG. 1 after forming a blanket layer of an antireflective coating (ARC) 14 on the front side surface 12 of the n-type semiconductor portion 10B of the semiconductor substrate 10. Although a single coating is described and illustrated, the ARC 14 employed in the present disclosure may include more than one coating. The blanket layer of ARC 14 that can be employed in the present disclosure includes a conventional ARC material such as, for example, an inorganic ARC or an organic ARC. In one embodiment of the present disclosure, the ARC material comprises silicon nitride. The blanket layer of ARC 14 can be formed utilizing techniques well known to those skilled in the art. For example, an ARC composition can be applied to the front side surface 12 of the semiconductor substrate 10 (i.e., directly onto the exposed upper surface of the n-type semiconductor portion 10B) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

At this point of the present disclosure, the back side surface 13 of the p-type semiconductor portion 10A of the semiconductor substrate 10 may be processed to form a metal back side surface electrical contact (not shown). When the substrate 10 includes a p-type semiconductor portion atop an n-type semiconductor portion, the bottommost surface of the n-type semiconductor portion would represent the back side surface of the substrate which could be processed to include a metal back side surface electrical contact. In one embodiment, the metal back side surface electrical contact can be formed by applying a metallic paste, such as Al paste, Ag paste, or AlAg paste, to the back side surface 13 of the semiconductor substrate 10. After applying the metallic paste, the applied metallic paste is heated at an elevated temperature (typically between 700° C. to 900° C.) which causes the metallic paste to flow and form a metal back surface field, i.e., the back side surface electrical contact, of the structure.

Figure 3:
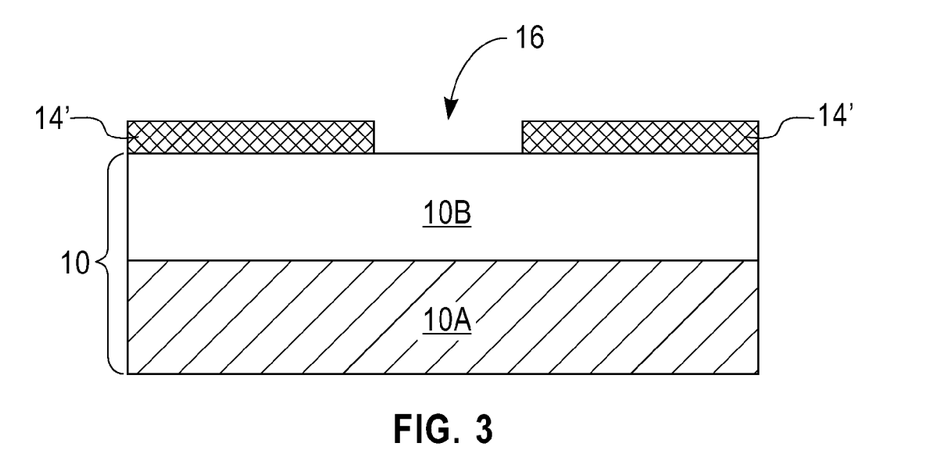
FIG. 3 is a pictorial representation (through a cross sectional view) illustrating the structure of FIG. 2 after patterning the blanket layer of antireflective coating forming a plurality of patterned antireflective coatings having one or a plurality of open grid patterns.

Referring now to FIG. 3, there is illustrated the structure of FIG. 2 after patterning the blanket layer of ARC 14 forming a plurality of patterned antireflective coatings (ARCs) 14' having an open grid pattern 16 located therein. Although the cross sectional drawings show the presence of a single opening formed into the blanket layer of ARC 14, a plurality of such openings would be formed providing a grid pattern to the front side surface 12 of the semiconductor substrate 10. In one embodiment, the plurality of patterned ARCs 14' can be formed by lithography and etching. The lithographic process includes applying a photoresist (not shown) to an upper surface of the blanket layer of ARC 14, exposing the photoresist to a desired pattern of radiation and developing the exposed photoresist utilizing a conventional resist developer. A patterned photoresist is thus provided. The pattern in the photoresist is transferred to the blanket layer of ARC 14 utilizing an etching process such as, for example, dry etching or chemical wet etching. After transferring the pattern from the patterned photoresist to the underlying blanket layer of ARC 14, the patterned photoresist is typically removed from the structure utilizing a conventional resist stripping process such as, for example, ashing. In another embodiment, the blanket layer of ARC 14 can be patterned utilizing ink jet printing or laser ablation. In yet another embodiment, the exposed front side surface 12 in the open grid pattern 16 can be further treated to increase the doping level. In these cases, the top semiconductor material portion is thicker or has higher dopant concentration under the exposed region of the front side surface 12.

Figure 4:
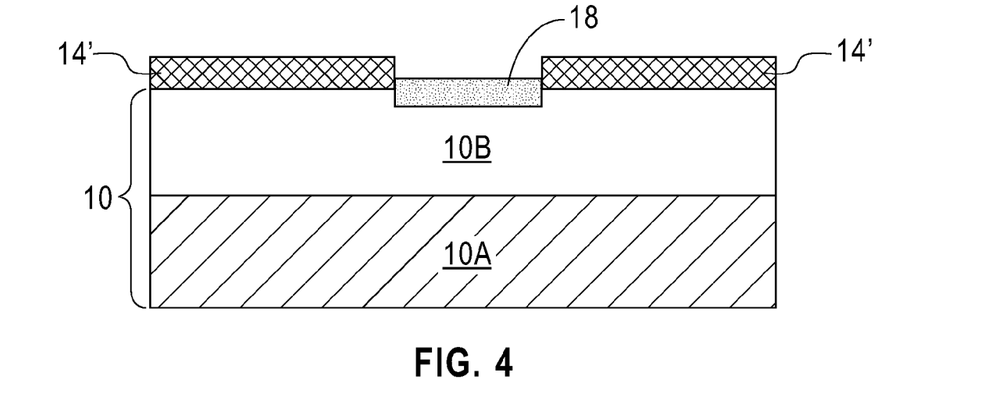
FIG. 4 is a pictorial representation (through a cross sectional view) illustrating the structure of FIG. 3 after forming a multimetal semiconductor alloy layer into the open grid pattern.

Referring now to FIG. 4, there is illustrated the structure of FIG. 3 after forming a multimetal semiconductor alloy layer 18 into the open grid pattern 16, i.e., atop the exposed portions of the n-type semiconductor portion 10B of the semiconductor substrate 10 that are not covered by the patterned ARC layers 14'.

Although the following drawings and description illustrate the multimetal semiconductor alloy layer 18 as a semiconductor alloy layer with two metal elements and one semiconductor element, the following description can also be applied to structures and processes containing a semiconductor alloy layer with more than two metal elements, e.g., three, four, five, etc., and one semiconductor element.

It is also noted that the following description can also be used in embodiments in which a single metal semiconductor alloy is formed from a multimetal layer. In such an embodiment, only the first elemental metal is present in the semiconductor alloy. When a single metal semiconductor alloy layer is formed, the single metal semiconductor alloy layer consists essentially of the first elemental metal and a semiconductor component; the second elemental metal is removed from the structure after the formation of the metal semiconductor alloy. The drawings provided herein are also applicable for cases in which a single metal semiconductor alloy is formed. In such cases, element 18 could also be used to represent the single metal semiconductor alloy that is formed.

In the present disclosure, the multimetal semiconductor alloy layer 18 includes at least a first elemental metal that forms an alloy with a semiconductor material at a first temperature and at least a second elemental metal that differs from the first elemental metal and that does not form an alloy with the semiconductor material at the first temperature. The second elemental metal may form an alloy with a semiconductor material at a second temperature, which is higher than the first temperature, or the second elemental metal does not form an alloy with a semiconductor material. Depending on the condition of the formation of the multimetal semiconductor alloy, the multimetal semiconductor alloy may be a homogeneous single alloy with both metal elements and semiconductor, a mixture of different metal semiconductor alloys with both metal elements with different compositions, or as a mixture of the metal semiconductor alloy of the first metal element and the second elemental metal. Therefore, and in some embodiments, the multimetal semiconductor alloy layer 18 of the present disclosure thus may be referred to as a first metal semiconductor alloy that further includes a second elemental metal that is not alloyed with a semiconductor material. Stated in different terms, the multimetal semiconductor alloy layer 18 may be referred to as a metal semiconductor alloy (first elemental metal alloyed with a semiconductor material) that contains a non-alloyed second elemental metal within the matrix of the metal semiconductor alloy. As such, the second elemental metal that is present in the multimetal semiconductor alloy layer may be considered as a dopant or additive that is present within the matrix of the first elemental metal semiconductor alloy.

In one embodiment of the present disclosure, the second elemental metal in above description comprises one second elemental metal that is different from the first metal and does not form a semiconductor alloy at the same temperature as the first metal. In another embodiment, the second elemental metal can comprise two or more second elemental metals that are different from the first elemental metal and do not form a semiconductor alloy at the same temperature as the first elemental metal.

The multimetal semiconductor alloy layer 18 is formed by providing a multimetal layer (not shown) onto the exposed portions of the n-type semiconductor portion 10B of the semiconductor substrate 10 that are not protected by the patterned ARC layers 14', and then subjecting the structure to an anneal, at a temperature same as or higher than the first temperature. The multimetal layer includes at least a first elemental metal that forms an alloy with a semiconductor material at a first temperature and at least a second elemental metal that does not form an alloy with the semiconductor material at the first temperature. In one embodiment, the second elemental metal may form an alloy with a semiconductor material at a second temperature, which is greater than the first temperature. In another embodiment, the second elemental metal does not form any alloy with a semiconductor material.

In one embodiment of the present disclosure, the ratio of the first elemental metal in the multimetal layer (not shown) that forms an alloy with a semiconductor material at the first temperature to the second elemental metal that does not form an alloy with a semiconductor material at the first temperature is from 10000:1 to 1:100. In another embodiment of the present disclosure, the ratio of the first elemental metal that forms an alloy with a semiconductor material at the first temperature to the second elemental metal that does not form an alloy with a semiconductor material at the first temperature is from 100:1 to 1:100. In yet another embodiment of the present disclosure, the ratio of the first elemental metal that forms an alloy with a semiconductor material at the first temperature to the second elemental metal that does not form an alloy with a semiconductor material at the first temperature is from 10:1 to 1:10.

In one embodiment, the first elemental metal reacts with the semiconductor atoms from the underlying n-type semiconductor portion 10B forming a metal semiconductor alloy and the second elemental metal does not react with the semiconductor atoms but diffuses into the matrix of the metal semiconductor alloy of the first elemental metal, resulting in a multimetal semiconductor alloy 18 with the metal semiconductor alloy of the first elemental metal and the second elemental metal within the matrix thereof.

In another embodiment, the first elemental metal and the second elemental metal both react with the semiconductor atoms from the underlying n-type semiconductor portion 10B forming a multimetal semiconductor alloy 18 with the first and second elemental metals alloying with semiconductor elements. In one embodiment, the multimetal semiconductor alloy layer 18 comprises a single homogeneous multimetal semiconductor alloy comprising both the first and the second elemental metals. In another embodiment, the multimetal semiconductor alloy layer 18 comprises a mixture of metal semiconductor alloys comprising the first and second elemental metals. In one embodiment, the multimetal semiconductor alloy layer 18 comprises a multimetal silicide. In another embodiment, the multimetal semiconductor alloy layer 18 comprises a multimetal germanide.

The first elemental metal that is present in the multimetal layer includes, but is not limited to, Ni, Co, Fe, Mo, Pt, and Pd. In one embodiment, the first elemental metal is Ni. In another embodiment, the first elemental metal is Co. The second elemental metal that is present in the multimetal layer includes, but is not limited to, Co, Fe, Mo, Pt, Pd, Ru, W, Zn, Sn, and Ag.

Examples of multimetal layers that can be used thus include, but are not limited to, NiCo, NiPt, NiPd, CoPd, NiRu, CoRu, NiW and CoW. Examples of multimetal layers that comprises more than one second elemental metals that can be used include, but are not limited to, NiCoPt, NiCoPd, NiRuPd, and NiCoW.

In some embodiments, and prior to the electrodeposition of the multimetal layer, the exposed surface(s) of the front side surface 12 of the semiconductor substrate 10 can be cleaned using a conventional cleaning process that is well known to those skilled in the art which is capable of removing surface oxides and other contaminants from the exposed surface(s) of the semiconductor material. For example, a diluted HF solution can be used to clean the exposed front side surface 12 of the semiconductor substrate 10.

The multimetal layer (which is not shown) can be formed by electrodeposition. The electrodeposition method employed in forming multimetal layer includes the use of any conventional electroplating apparatus that is well known to those skilled in the art. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed portions of the front side surface 12 of the semiconductor substrate 10 (i.e., either the n-type semiconductor portion 10B, if the n-type semiconductor portion is located atop the p-type semiconductor portion, or the p-type semiconductor portion, if the p-type semiconductor portion is located atop the n-type semiconductor portion) are employed as the cathode of the circuit. The anode that is employed in the electrodeposition process may or may not be made of the same metal as to be plated. In the present disclosure, the structure shown in FIG. 3 is immersed in an electroplating bath (e.g., an electrolyte) containing an anode and two dissolved metal salts (to be further defined here below) as well as other ions that permit the flow of electricity. A power supply supplies a direct current to the anode and plating occurs at the cathode (i.e., the exposed front side surface 12 of the semiconductor substrate).

The electroplating bath that can be employed in the present disclosure includes two or more metal ions to plate the multimetal layer. The sources of metal ions provide metal ions which include, but are not limited to, Ni, Co, Fe, Mo, Pt, Pd, W, Zn, Sn, Ag and Ru. In one embodiment, Ni is chosen as a first elemental metal to be plated from the electroplating bath, and Co, Pt, Pd, W, Mo or Ru is chosen as a second elemental metal to be plated from the electroplating bath. In another embodiment, Ni is chosen as a first elemental metal to be plated from the electroplating bath, and CoPt, CoPd, CoW, CoMo or CoRu is chosen as a second elemental metal to be plated from the electroplating bath.

The one or more sources of metal ions that can be present in the electroplating bath include metal salts. The metal salts that can be used include, but are not limited to, metal halides, metal nitrates, metal sulfates, metal sulfamates, metal pyrophosphate, metal alkane sulfonates, metal alkanol sulfonate, metal cyanides, metal acetates or metal citrates.

Some of the various types of metal salts that can be employed in the present disclosure are now described in greater detail.

Nickel (Ni) salts which may be used in the electroplating bath include, but are not limited to, one or more of nickel chloride, nickel sulfamate, nickel acetate, nickel ammonium sulfate, and nickel sulfate.

Palladium (Pd) salts which may be used in the electroplating bath include, but are not limited to, one or more of palladium chloride, palladium nitrate, palladium sulfate, and sodium chloropalladate.

Platinum (Pt) salts which may be use include, but are not limited to, one or more of platinum tetrachloride, platinum sulfate and sodium chloroplatinate.

Sources of cobalt (Co) ions include, but are not limited to, one or more of cobalt halides, cobalt nitrates, cobalt sulfates, cobalt sulfamates, cobalt alkane sulfonates, cobalt alkanol sulfonate, cobalt pyrophosphate, cobalt cyanides, cobalt acetates and cobalt citrates.

Sources of iron (Fe) ions include, but are not limited to, one or more of iron halides, iron sulfates, iron sulfamates, iron alkane sulfonates, iron alkanol sulfonate, iron pyrophosphate, iron cyanides, iron acetates and iron citrates.

Sources of tungsten (W) ions include, but are not limited to, one or more of sodium tungstate, and potassium tungstate.

Sources of molybdenum (Mo) ions include, but are not limited to, one or more of sodium molybdate, ammonium molybdate.

Sources of zinc (Zn) ions include, but are not limited to, one or more of zinc oxide, zinc halides, zinc sulfates, zinc sulfamates, zinc alkane sulfonates, zinc alkanol sulfonate, zinc pyrophosphate, zinc cyanides, zinc acetates and zinc citrates.

Sources of tin (Sn) ions include, but are not limited to, one or more of tin oxide, tin halides, tin sulfates, tin sulfamates, tin alkane sulfonates, tin alkanol sulfonate, tin pyrophosphate, tin cyanides, tin acetates and tin citrates.

Sources of silver (Ag) ions include, but are not limited to, one or more of silver nitrate, silver sulfates, silver acetates, and silver cyanide.

Sources of ruthenium (Ru) ions include, but are not limited to, one or more of ruthenium halides, ruthenium sulfate, and ruthenium nitrohalides.

In general, the metal salts are included in the electroplating bath such that metal ions range in concentrations from 0.01 g/L to 200 g/L, or such as from 0.5 g/L to 150 g/L, or such as from 1 g/L to 100 g/L, or such as from 5 g/L to 50 g/L. Typically, metal salts are included in amounts such that metal ion concentrations range from 0.01 to 100 g/L, more typically from 0.1 g/L to 60 g/L.

The electroplating bath that can be used may include one or more conventional diluents. Typically, the electroplating bath is aqueous; however, conventional organic diluents may be used if desired. Optional conventional electroplating bath additives also may be included. Such additives include, but are not limited to, one or more of complexing agents, brighteners, suppressors, surfactants, pH adjusting compounds. These additives can be inorganic or organic compounds.

Alkali metal salts which may be included in the electroplating bath include, but are not limited to, sodium and potassium salts of halogens, such as chloride, fluoride and bromide. Typically chloride is used. Such alkali metal salts are used in conventional amounts.

In addition to the above, the electroplating bath may also include hardeners, malleability, ductility and deposition modifiers, and the like.

The measured pH of the electroplating bath may range from −1 to 14, or such as from 0 to 12. Typically, the pH of the electroplating bath ranges from 0 to 5 or 8 to 12, more typically, from 0 to 3 or 9 to 12. Conventional buffering compounds may be included to control the pH of the electroplating bath.

The electroplating baths are typically maintained in a temperature range of from 20° C. to 110° C., with a temperature from 20° C. to 50° C. being more typical. Plating temperatures may vary depending on the metal to be plated.

The electrodeposition process employed in forming the multimetal layer uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the multimetal layer.

By "low current density" it is meant a plating density within a range from 1 mAmps/cm$^2$ to 20 mAmps/cm$^2$. By "high current density" it is meant a plating density of greater than 20 mAmps/cm$^2$ (a general range for the high current density regime is from greater than 20 mAmps/cm$^2$ to 200 mAmps/cm$^2$. The increase from the low current density regime to the high current density regime or decrease from the high current density regime to the low current density regime may include a continuous ramp or it may include various ramp and soak cycles including a sequence of constant current plateaus.

In some embodiments of the present disclosure, light illumination can be used to increase metal nucleation and growth during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source can be used. The intensity of the light employed may vary and is typically greater than 10 W/m$^2$, with an intensity of light from 100 W/m$^2$ to 500 W/m$^2$ being more typical. The combination of the aforementioned waveform and light illumination enables one to provide complete coverage of a metallic film on the surface of a semiconductor substrate used in solar cell applications. p The thickness of the multimetal layer that is formed and is used in forming the multimetal semiconductor alloy layer 18 is typically within the range from 20 nm to 500 nm, with a thickness from 100 nm to 300 nm being more typically. Other thicknesses that are above or below the aforementioned thickness ranges can also be employed in the present application.

After forming the multimetal layer, and as mentioned above, an anneal is performed that causes the metal atoms of the multimetal layer to react with semiconductor atoms from the underlying semiconductor substrate 10 forming the multimetal semiconductor alloy layer 18. In the present disclosure, the anneal is performed at a temperature that is the same as or higher than the first temperature where the first elemental metal forms an alloy with the underlying semiconductor material. The anneal may be performed in a single step or a multiple-step anneal process can be used. In one embodiment, the anneal is performed at a temperature of about 250° C. or greater. In another embodiment, the anneal is performed at a temperature from 300° C. to 700° C. Annealing can be performed in air, forming gas, He, Ar, Ne, Kr, N$_2$ or the combination thereof. The anneal includes a furnace anneal, a rapid thermal anneal, a spike anneal, a microwave anneal or a laser anneal. Typically, the anneal is a rapid thermal anneal, a belt furnace anneal, or an oven anneal in which the anneal time is about typically less than 60 minute. Following the final anneal step, any unreacted metal layer is removed from the structure utilizing an etching process that selectively removes the unreacted metal from the structure.

The multimetal semiconductor alloy layer 18 that is formed after annealing has a thickness that is typically from 10 nm to 300 nm, with a thickness from 10 nm to 150 nm being more typical. Other thicknesses above and below the aforementioned ranges are also possible depending on the initial thickness of the multimetal layer, the ratio of the first and second elemental metals in the multimetal layer and the conditions of the anneal used to convert the multimetal layer to the multimetal semiconductor alloy layer 18 of the present disclosure.

In some embodiments, and as shown in FIG. 4, the multimetal semiconductor alloy layer 18 is a continuous layer. By "continuous", it is meant that the multimetal semiconductor alloy layer 18 that is formed has no breaks in the entire length of the substrate that it is formed upon.

In some embodiments, the annealing condition, the initial thickness of the multimetal layer and the ratio of the first and second elemental metals in the multimetal layer are such that all the first elemental metal in the multimetal layer reacts completely with the semiconductor, some portion of the second elemental metal diffuses into the semiconductor alloy of the first metal, and the unreacted portion of the second elemental metal is removed after the anneal.

In some other embodiments, the annealing condition, the initial thickness of the multimetal layer and the ratio of the first and second elemental metals in the multimetal layer are such that only some portion of the first elemental metal in the multimetal layer reacts with the semiconductor, some portion of the second elemental metal diffuses into the semiconductor alloy of the first metal, and the unreacted portion of the first elemental metal and the unreacted portion of the second elemental metal are removed after the anneal.

In some other embodiments, the annealing condition, the initial thickness of the multimetal layer and the ratio of the first and second elemental metals in the multimetal layer are such that all the first elemental metal and some portion of the second elemental metal in the multimetal layer react with the semiconductor, and the unreacted portion of the second elemental metal is removed after the anneal.

In some other embodiments, the annealing condition, the initial thickness of the multimetal layer and the ratio of the first and second elemental metals in the multimetal layer are such that some portion of the first elemental metal and some portion of the second elemental metal in the multimetal layer react with the semiconductor, and the unreacted portion of the first elemental metal and the unreacted portion of the second elemental metal are removed after the anneal.

The ratio of the first and second elemental metal in the multimetal semiconductor alloy layer 18 depends on the annealing condition, the initial thickness of the multimetal layer and the ratio of the first and second elemental metals in the multimetal layer. In one embodiment of the present disclosure, the ratio of the first and the second elemental metal is from 10000:1 to 1:100. In another embodiment of the present disclosure, the ratio of the first and the second elemental metal is from 100:1 to 1:10. In yet another embodiment of the present disclosure, the ratio of the first and the second elemental metal is 10:1 to 1:10.

As noted above, and in some embodiments of the present disclosure, the annealing condition, the initial thickness of the multimetal layer and the ratio of the first and second elemental metals in the multimetal layer are such that only the first elemental metal in the multimetal layer reacts with the semiconductor, the second elemental metal is not present in the metal semiconductor alloy, and the semiconductor alloy is a single metal semiconductor alloy.

Figure 5:
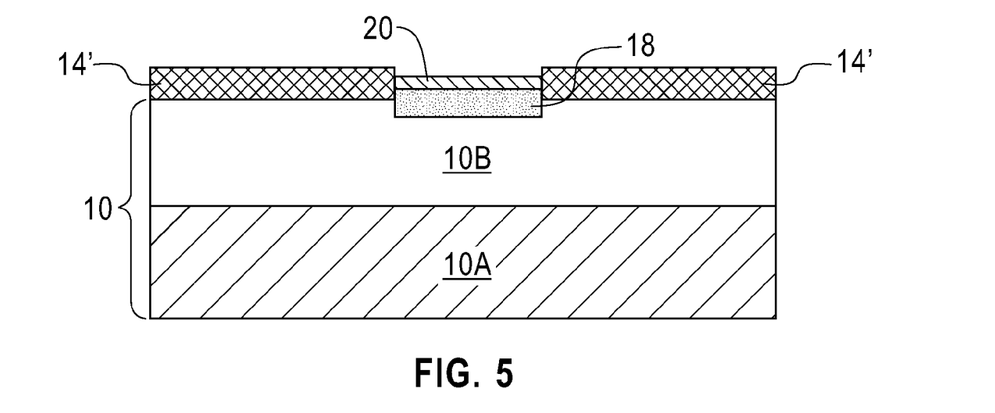
FIG. 5 is a pictorial representation (through a cross sectional view) illustrating the structure of FIG. 4 after electrodepositing, i.e., electroplating, an optional metal diffusion barrier layer on the multimetal semiconductor alloy layer.

Referring now to FIG. 5 there is illustrated the structure of FIG. 4 after forming an optional metal diffusion barrier layer 20 within the grid pattern and on an exposed surface of the multimetal semiconductor alloy layer 18. In some embodiments, the optional metal diffusion barrier layer 20 can be omitted from the structure. The optional metal diffusion barrier layer 20 is formed by electrodeposition, i.e., electroplating. In the present disclosure, the optional metal diffusion barrier layer 20 serves to hinder the diffusion of copper from an overlying copper-containing layer to be subsequently formed.

The optional metal diffusion barrier layer 20 that is formed includes a metal or metal alloy other than copper or a copper alloy. In one embodiment of the present application, the optional metal diffusion barrier layer 20 can be comprised of Ni, Co, Zn, Pt, Ag, Pd, Sn, Fe, P, S, As, Sb, Mo, W, In or alloys thereof. In another embodiment, the optional metal diffusion barrier layer 20 may be comprised of Ni, Co, Zn, Pt, Fe or alloys thereof. In a further embodiment of the present disclosure, the optional metal diffusion barrier layer 20 may be comprised of Ni or a Ni alloy. In a yet further embodiment of the present disclosure, the optional metal diffusion barrier layer 20 may be comprised of Co or a Co alloy. In any of the embodiments mentioned above, the optional metal diffusion barrier layer 20 itself does not include copper or a copper alloy.

The electrodeposition method employed in forming optional metal diffusion barrier layer 20 is the same as that described above in forming the multimetal layer. The electroplating bath that can be employed in the present disclosure includes one or more sources of metal ions to plate the optional metal diffusion barrier layer 20. The one or more sources of metal ions provide metal ions which include, but are not limited to, Ni, Co, Zn, Pt, Ag, Pd, Sn, Fe, P, S, As, Sb, Mo, W, and In. Alloys that can be electrodeposited (or plated) include, but are not limited to, binary and ternary alloys of the foregoing metals. In one embodiment, metals chosen from Ni, Co, Zn, Pt and Fe are plated from the electroplating bath. In another embodiment, Ni or a Ni alloy is plated from the electroplating bath. In yet another embodiment, Co or a Co alloy is plated from the electroplating bath.

The one or more sources of metal ions that can be present in the electroplating bath include metal salts. The metal salts that can be used include, but are not limited to, metal halides, metal nitrates, metal sulfates, metal sulfamates, metal alkane sulfonates, metal alkanol sulfonate, metal cyanides, metal acetates or metal citrates.

Some of the various types of metal salts that can be employed in the present disclosure are same as the description above.

The concentration of the metal ions within the plating bath that are used in forming the optional metal diffusion barrier layer 20 is with the range mentioned above. The plating bath used in forming the optional metal diffusion barrier layer 20 may include diluents (aqueous or organic), additives, and modifiers as also mentioned above for plating the multimetal layer.

The conditions of the electodeposition (i.e, bath temperature, current density and optional light illumination) that can be used in forming the optional metal diffusion barrier layer 20 are the same as mentioned above for forming the multimetal layer.

The thickness of the optional metal diffusion barrier layer 20 that is electrodeposited may vary depending on the type of metal source being electrodeposited, the type of electroplating bath employed as well as the duration of the electrodeposition process itself. Typically, the optional metal diffusion barrier layer 20 that is formed has a thickness from 10 nm to 1000 nm, with a thickness from 50 nm to 300 nm being more typical.

Figure 6:
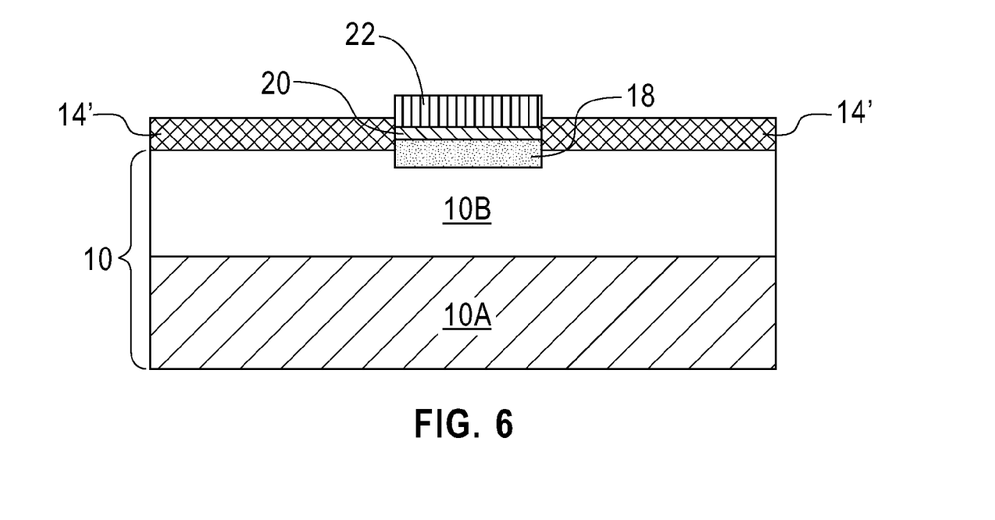
FIG. 6 is a pictorial representation (through a cross sectional view) illustrating the structure of FIG. 5 after electrodepositing a copper-containing layer on an upper surface of the optional metal diffusion barrier layer.

Referring now to FIG. 6, there is illustrated the structure of FIG. 5 after electrodepositing a copper-containing layer 22 atop the optional metal diffusion barrier layer 20. In embodiments in which the optional diffusion barrier layer 20 is omitted from the structure, the copper-containing layer 22 would be formed on an upper exposed surface of the multimetal semiconductor alloy layer 18. The copper-containing layer 22 that is formed comprises copper or a copper alloy.

The electrodeposition of copper-containing layer 22 atop either the multimetal semiconductor alloy layer 18 or the optional the metal diffusion barrier layer 20 is the same as that described above for electrodeposition of the multimetal layer except that a copper source is present in the bath used in forming the copper-containing layer 22.

The one or more sources of copper ions that can be present in the electroplating bath to form the copper-containing layer 22 include copper salts such as, but not limited to, copper halides, copper nitrates, copper sulfates, copper sulfamates, copper alkane sulfonates, copper alkanol sulfonate, copper pyrophosphate, copper cyanides, copper acetates and copper citrates.

The copper salts are included in the electroplating bath such that copper ions range in concentrations from 0.01 g/L to 200 g/L, or such as from 0.5 g/L to 150 g/L, or such as from 1 g/L to 100 g/L, or such as from 5 g/L to 50 g/L. Typically, copper salts are included in amounts such that copper ion concentrations range from 0.1 g/L to 100 g/L, more typically from 1 g/L to 60 g/L.

The copper electroplating bath that can be used to form the copper-containing layer 22 may include one or more conventional additives. Such additives include, but are not limited to, one or more of brighteners, suppressors, surfactants, leveler, inorganic acids, organic acids, brightener breakdown inhibition compounds, alkali metal salts, and pH adjusting compounds.

Suppressors include, but are not limited to, one or more of oxygen containing high molecular weight compounds such as carboxymethylcellulose, nonylphenolpolyglycol ether, octandiolbis-(polyalkylene glycolether), octanolpolyalkylene glycolether, oleic acid polyglycol ester, polyethylenepropylene glycol, polyethylene glycol, polyethylene glycoldimethylether, polyoxypropylene glycol, polypropylene glycol, polyvinyl alcohol, stearic acidpolyglycol ester, and stearyl alcoholpolyglycol ether. Typically poly(alkoxylated) glycols are used. Such suppressors may be included in the electroplating bath in conventional amounts, such as from 0.01 g/L to 10 g/L, or such as from 0.5 g/1 to 5 g/L.

In some embodiments, the electrodeposition of the copper-containing layer 22 can also include light illumination (as mentioned above) to increase metal nucleation and growth during the electrodeposition process.

The copper-containing layer 22 that is electroplated atop has a thickness that is generally greater than the thickness of that of the metal diffusion barrier layer 20. In one embodiment, the copper-containing layer 22 has a thickness from 100 nm to 50000 nm. In another embodiment, the copper-containing layer 22 has a thickness from 1000 nm to 10000 nm.

After forming the copper-containing layer 22, the copper-containing layer 22 can be further processed to include other material layers such as, but not limited to, diffusion barrier layers and/or passivation layers.

It is noted that photovoltaic devices including the multimetal semiconductor alloy layer 18 of the present disclosure have a better uniformity of metal semiconductor alloy thickness with easier control as compared to an equivalent device that does not include the multimetal semiconductor alloy layer 18. By "uniformity of thickness" it is meant the variation in the thickness of the semiconductor alloy layer with the grid opening is within +/−30 nm.

The thickness of metal semiconductor alloy formed by the anneal depends on the annealing temperature, the thickness of the initial multimetal layer, the properties of the initial multimetal layer and the semiconductor, and the impurities thereof. For a plated single metal layer of a first elemental metal on a certain semiconductor material, the thickness of the metal semiconductor alloy formed afterwards may vary depending on the local variations of the thickness and properties of the metal layer and semiconductor. In the present disclosure, the plated initial multimetal layer comprises not only the first elemental metal that forms semiconductor alloy at a first temperature but also the at least one second elemental metal that does not form a semiconductor alloy at the first temperature. The variation of the amount of the first elemental metal in the initial multimetal layer is less than the variation of the total amount of metals. In other words, the amount of the first elemental metal that is available to form the metal semiconductor alloy has much less variations as compared with the total amount of plated metal. Therefore, at a temperature where the second elemental metal does not form a metal semiconductor alloy, the thickness of metal semiconductor alloy layer formed from the multimetal layer has a smaller thickness variation compared with a metal semiconductor alloy formed from an initial metal layer of the first elemental metal only.

In one embodiment of the present disclosure, the first elemental metal in the initial multimetal layer fully reacts with the underlying semiconductor material.

In another embodiment of the present disclosure, the first elemental metal in the initial multimetal layer partially reacts with the underlying semiconductor material.

In one embodiment of the present disclosure, the one or more second elemental metals in the initial multimetal layer do not react with the underlying semiconductor material.

In one embodiment of the present disclosure, the one or more second elemental metals in the initial multimetal layer react with the underlying semiconductor material, resulting in a metal semiconductor alloy with at least two metals. Photovoltaic devices including the multimetal semiconductor alloy layer 18 with at least two metal elements have better diffusion property for Cu as compared to an equivalent device that does not include the multimetal semiconductor alloy layer 18.

Figure 7:
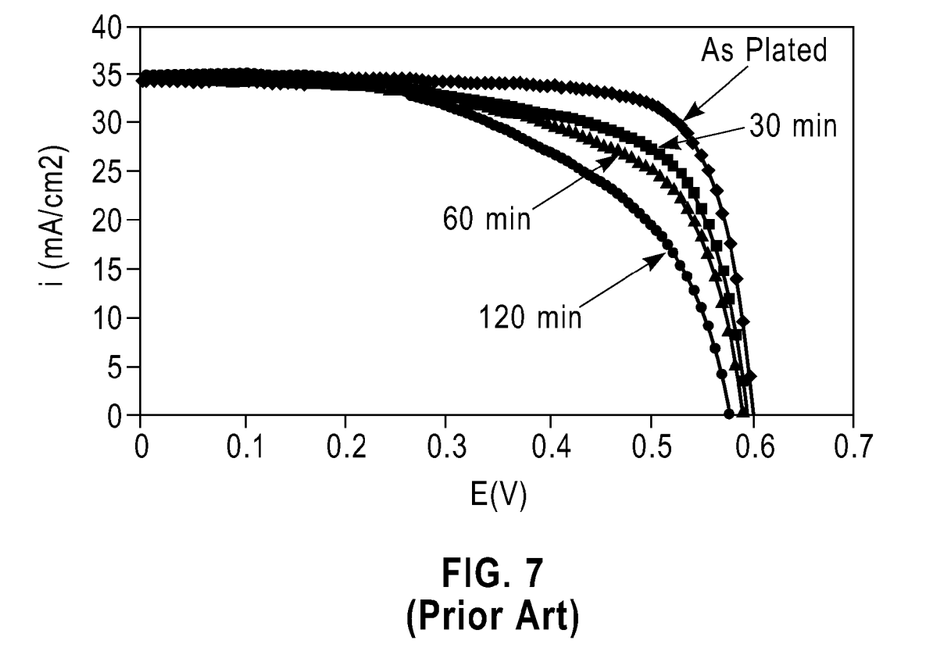
FIG. 7 is a plot of current, I (mAmps/cm$^2$), vs. potential, E (V), for a prior art solar cell containing Si/NiSi/Ni/Cu after annealing in N$_2$ at 300° C.
Figure 8:
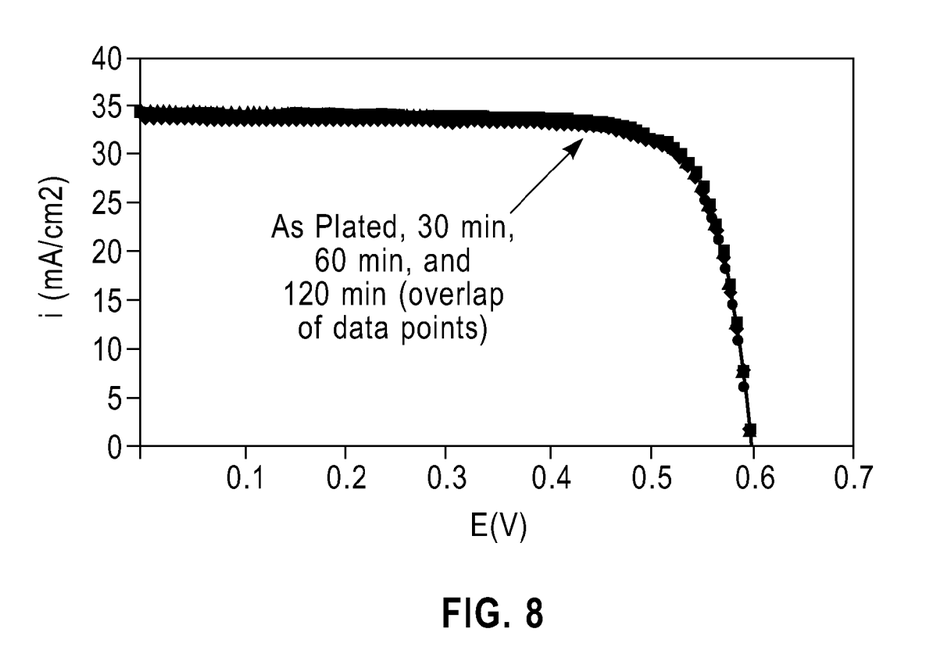
FIG. 8 is a plot of current, I (mAmps/cm$^2$), vs. potential, E (V), for a solar cell in accordance with the present disclosure containing Si/Ni$_x$Co$_y$Si/Ni/Cu after annealing in N$_2$ at 300° C.

In addition to the above, the presence of the multimetal semiconductor alloy layer 18 in a photovoltaic device improves the lifetime of the device, as compared to an equivalent device that does not include the multimetal semiconductor alloy layer 18. This is shown, for example, in FIGS. 7 and 8. Specifically, FIG. 7 is a plot of current, I (mAmps/cm$^2$), vs. potential, E (V), for a prior art solar cell containing Si/NiSi/Ni/Cu after annealing in N$_2$ at 300° C., while FIG. 8 is a plot of current, I (mAmps/cm$^2$), vs. potential, E (V), for a solar cell in accordance with the present disclosure containing Si/Ni$_x$-Co$_y$Si/Ni/Cu after annealing in N$_2$ at 300° C. It is observed that the solar cell shown in FIG. 7 shows significant shunts after the anneal, while the solar cell shown in FIG. 8 showed no degradation of device performance.

Reference is now made to the following example which demonstrates some advantages that can be obtained by forming a multimetal semiconductor alloy layer of the present disclosure within a solar cell as compared to a solar cell that includes a single metal semiconductor alloy layer.

EXAMPLE

As stated above, this example compares solar cells including a multimetal semiconductor alloy layer of the present disclosure as compared to solar cells that include a single metal semiconductor alloy layer. Each of the solar cells included a Si substrate having an n-type Si portion overlying a p-type Si portion. The front side surface of each solar cell was thus the exposed upper surface of the n-type Si portion of the Si substrate. A grid pattern was formed on the front side surface as described herein above. After forming the grid pattern on the front side surface of the semiconductor substrate, a single metal semiconductor alloy, i.e., Ni silicide, was formed in some cases on the exposed front side surface, by electrodeposition of a layer of Ni then annealing. In other cases, a bimetal semiconductor alloy, i.e., NiCo silicide, was formed on the exposed front side surface, by electrodeposition of a bimetal layer of Ni and Co and then annealing. In these cases, the first elemental metal is Ni and the second elemental metal is Co. The conditions used to plate Ni and a bimetal layer of Ni and Co included a current density of 16 mA/cm$^2$ for 50 seconds. For comparison, a single metal layer, i.e., Co, was also plated and annealed.

In this example, the content of the Ni and Co within the bimetal layer was varied as shown in the table below. The table below also shows anneal conditions and the sheet resistance, Rs (ohm/sq.), for the various solar cells produced in the above manner. After forming either the single metal semiconductor alloy layer or the multimetal semiconductor alloy layer, a copper containing layer was formed thereon as described above.

TABLE

| Example | Ni—Co ion concentration ratio in plating solution | Ni % within the bimetal layer 18 | Rs (sheet resistance, ohm/sq) of silicide formed at different anneal conditions | | | | | |
|---|---|---|---|---|---|---|---|---|
| | | | 300° C., 120 secs | 400° C., 60 secs | 400° C., 300 secs | 400° C., 1800 secs | 450° C., 300 secs | 450° C., 1800 secs |
| 1 | Pure Ni | 100% | 9.1 | 1.3 | 0.5 | 0.3. | 0.3 | 0.2 |
| 2 | Ni:Co 9:1 | 49% | 84 | 21 | 4.1 | 1.1 | 1.1 | 0.6 |
| 3 | Ni:Co 3:1 | 35% | 92 | 77 | 4.1 | 32 | 16 | 2.2 |
| 4 | Ni:Co 1:1 | 15% | 96 | 97 | 92 | 94 | 101 | 95 |
| 5 | Ni:Co 1:3 | 3% | 88 | 90 | 97 | 88 | 93 | 91 |
| 6 | Pure Co | 0% | 91 | 92 | 101 | 100 | 103 | 102 |

As shown in the above table, the sheet resistance, Rs (ohm/sq.) of a Si substrate is about 90 to 100 ohm/sq. When a metal semiconductor alloy layer was formed on the Si substrate, the sheet resistance dropped. The lower the Rs was, the thicker the metal semiconductor alloy layer was. For pure Ni, Ni silicide formed at 300° C., 120 second anneal. For pure Co, nothing formed at a temperature up to 450 ° C. For a bimetal alloy of NiCo with different Ni%, metal semiconductor alloys with different thickness can be formed at various temperatures between 300° C. and 450° C.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
a semiconductor substrate including a p-n junction with a p-type semiconductor portion and an n-type semiconductor portion one on top of the other, wherein an upper exposed surface of one of the semiconductor portions represents a front side surface of the semiconductor substrate;
patterned antireflective coatings on the front side surface of the semiconductor substrate, wherein said patterned antireflective coatings protect some portions of the front side surface of the semiconductor substrate, while leaving other portions of the front side surface of the semiconductor substrate exposed, said other portions of the front side surface of the semiconductor substrate that are exposed form a grid pattern on the front side surface;
a multimetal semiconductor alloy layer located on the other portions of the front side surface of the semiconductor substrate that are exposed, wherein said multimetal semiconductor alloy comprises at least a first elemental metal that forms an alloy with a semiconductor material at a first anneal temperature, and at least a second elemental metal that differs from the first elemental metal and that does not form an alloy with a semiconductor material at said first anneal temperature, and wherein said multimetal semiconductor alloy layer has a bottommost surface located below an uppermost surface of the front side surface of the semiconductor substrate; and
a copper-containing layer in direct physical contact with the multimetal semiconductor alloy layer, wherein said copper-containing layer has sidewall surfaces that are vertically coincident to sidewall surfaces of said multimetal semiconductor alloy layer.

2. The photovoltaic device of claim 1, wherein said n-type semiconductor portion overlies said p-type semiconductor portion.

3. A photovoltaic device comprising:
a semiconductor substrate including a p-n junction with a p-type semiconductor portion and an n-type semiconductor portion one on top of the other, wherein an upper exposed surface of one of the semiconductor portions represents a front side surface of the semiconductor substrate;
patterned antireflective coatings on the front side surface of the semiconductor substrate, wherein said patterned antireflective coatings protect some portions of the front side surface of the semiconductor substrate, while leaving other portions of the front side surface of the semiconductor substrate exposed, said other portions of the front side surface of the semiconductor substrate that are exposed form a grid pattern on the front side surface;

a multimetal semiconductor alloy layer located on the other portions of the front side surface of the semiconductor substrate that are exposed, wherein said multimetal semiconductor alloy comprises at least a first elemental metal that forms an alloy with a semiconductor material at a first anneal temperature, and at least a second elemental metal that differs from the first elemental metal and that does not form an alloy with a semiconductor material at said first anneal temperature, and wherein said multimetal semiconductor alloy layer has a bottommost surface located below an uppermost surface of the front side surface of the semiconductor substrate and a sidewall surface that is in direct physical contact with a sidewall surface of the patterned antireflective coatings;

a metal diffusion barrier located on a topmost surface of the multimetal semiconductor alloy layer; and a copper containing located on a topmost surface of said metal diffusion barrier, wherein said copper-containing layer has sidewall surfaces that are vertically coincident to sidewall surfaces of said multimetal semiconductor alloy layer.

4. The photovoltaic device of claim 3, wherein said metal diffusion barrier layer comprises Ni, Co, P, or S, and the combination thereof and said copper-containing layer comprises copper.

5. The photovoltaic device of claim 1, wherein said first elemental metal is Ni and said second elemental metal is Co, Fe, Pt, Pd, W, Mo, Ag, Sn, Zn, or Ru.

6. The photovoltaic device of claim 1, wherein said first elemental metal is Co and said second elemental metal is Fe, Pt, Pd, W, Mo, Ag, Sn, Zn, or Ru.

7. The photovoltaic device of claim 1, wherein said multimetal semiconductor alloy layer has a ratio of the first elemental metal to the second elemental metal from 10000:1 to 1:100.

8. The photovoltaic device of claim 3, wherein said multimetal semiconductor alloy layer comprises Ni as said first elemental metal and Co, Fe, Pt, Pd, W, Mo, Ag, Sn, Zn, or Ru as said second elemental metal, said metal diffusion barrier layer comprises nickel, and said copper-containing layer comprises copper.

9. The photovoltaic device of claim 8, wherein said first elemental metal is Ni, said second elemental metal is Co, said diffusion barrier layer is Ni.

10. The photovoltaic device of claim 3, wherein said first elemental metal is Ni, said second elemental metal is Co, said diffusion barrier layer is NiCo alloy.

11. The photovoltaic device of claim 3, wherein said multimetal semiconductor alloy layer comprises Ni as said first elemental metal and Co, Fe, Pt, Pd, W, Mo, Ag, Sn, Zn, or Ru as said second elemental metal, said metal diffusion barrier layer comprises cobalt, and said copper-containing layer comprises copper.

12. The photovoltaic device of claim 3, wherein said multimetal semiconductor alloy layer comprises Co as said first elemental metal and Fe, Pt, Pd, W, Mo, Ag, Sn, Zn, or Ru as said second elemental metal, said metal diffusion barrier layer comprises nickel, and said copper-containing layer comprises copper.

13. The photovoltaic device of claim 3, wherein said multimetal semiconductor alloy layer comprises Co as said first elemental metal and Fe, Pt, Pd, W, Mo, Ag, Sn, Zn, or Ru as said second elemental metal, said metal diffusion barrier layer comprises cobalt and said copper-containing layer comprises copper.

14. The photovoltaic device of claim 1, wherein said semiconductor substrate is a component of a solar cell.

15. The photovoltaic device of claim 1, wherein said multimetal semiconductor alloy layer comprises a metal semiconductor alloy of said first elemental metal containing said second elemental metal as a dopant.

16. The photovoltaic device of claim 1, wherein said multimetal semiconductor alloy comprises a homogeneous single metal semiconductor alloy containing both said first and second elemental metals.

17. The photovoltaic device of claim 1, wherein said multimetal semiconductor alloy comprises a mixture of different semiconductor alloys of both said first and second elemental metals.

18. The photovoltaic device of claim 1, wherein said multimetal semiconductor alloy comprises a mixture of a first metal semiconductor alloy comprising said first elemental metal and a second metal semiconductor alloy comprising said second elemental metal.

19. The photovoltaic device of claim 1, wherein an entirety of the front side surface is non-textured.

20. The photovoltaic cell of claim 1, wherein an entirety of the front side surface is textured.

21. The photovoltaic device of claim 1 wherein a sidewall surface of said multimetal semiconductor alloy directly contacts a sidewall surface of said patterned antireflective coatings.

22. The photovoltaic device of claim 1, wherein an entirety of a topmost surface of said multimetal semiconductor alloy is located above said front side surface of said semiconductor substrate.

23. The photovoltaic device of claim 3, wherein an entirety of the front side surface is non-textured.

24. The photovoltaic device of claim 3, wherein an entirety of the front side surface is textured.

25. The photovoltaic device of claim 3, wherein an entirety of a topmost surface of said multimetal semiconductor alloy is located above said front side surface of said semiconductor substrate.

26. A photovoltaic device comprising:
a semiconductor substrate including a p-n junction with a p-type semiconductor portion and an n-type semiconductor portion one on top of the other, wherein an upper exposed surface of one of the semiconductor portions represents a front side surface of the semiconductor substrate;

patterned antireflective coatings on the front side surface of the semiconductor substrate, wherein said patterned antireflective coatings protect some portions of the front side surface of the semiconductor substrate, while leaving other portions of the front side surface of the semiconductor substrate exposed, said other portions of the front side surface of the semiconductor substrate that are exposed form a grid pattern on the front side surface;

a multimetal semiconductor alloy layer located on the other portions of the front side surface of the semiconductor substrate that are exposed, wherein said multimetal semiconductor alloy comprises at least a first elemental metal that forms an alloy with a semiconductor material at a first anneal temperature, and at least a second elemental metal that differs from the first elemental metal and that does not form an alloy with a semiconductor material at said first anneal temperature, and wherein said multimetal semiconductor alloy layer has a bottommost surface located below an uppermost surface of the front side surface of the semiconductor substrate;

a metal diffusion barrier located on a topmost surface of the multimetal semiconductor alloy layer; and a copper-containing layer located on a topmost surface of said metal diffusion barrier, wherein said copper-containing layer has sidewall surfaces that are vertically coincident to sidewall surfaces of said multimetal semiconductor alloy layer, and wherein said first elemental metal is Ni, said second elemental metal is Co, said diffusion barrier layer is Ni or a NiCo alloy.

* * * * *